United States Patent
Xie et al.

(10) Patent No.: US 6,372,524 B1
(45) Date of Patent: Apr. 16, 2002

(54) METHOD FOR CMP ENDPOINT DETECTION

(75) Inventors: James J. Xie, San Jose; Jayanthi Pallinti, Santa Clara; Ronald J. Nagahara, San Jose, all of CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/946,895

(22) Filed: Sep. 5, 2001

Related U.S. Application Data
(60) Provisional application No. 60/273,959, filed on Mar. 6, 2001.

(51) Int. Cl.$^7$ .................................................. H01L 21/00
(52) U.S. Cl. ........................................................ 438/8
(58) Field of Search ........................ 438/8, 5–7, 9–13, 438/16, 880

(56) References Cited

U.S. PATENT DOCUMENTS

| | | |
|---|---|---|
| 5,245,790 A | 9/1993 | Jerbic |
| 5,265,378 A | 11/1993 | Rostoker |
| 5,290,396 A | 3/1994 | Schoenborn et al. |
| 5,298,110 A | 3/1994 | Schoenborn et al. |
| 5,310,455 A | 5/1994 | Pasch et al. |
| 5,321,304 A | 6/1994 | Rostoker |
| 5,389,194 A | 2/1995 | Rostoker et al. |
| 5,403,228 A | 4/1995 | Pasch |
| 5,441,094 A | 8/1995 | Pasch |
| 5,471,091 A | 11/1995 | Pasch et al. |
| 5,516,400 A | 5/1996 | Pasch et al. |
| 5,532,516 A | 7/1996 | Pasch et al. |
| 5,624,304 A | 4/1997 | Pasch et al. |
| 5,626,715 A | 5/1997 | Rostoker |
| 5,667,433 A | 9/1997 | Mallon |
| 5,674,774 A | 10/1997 | Pasch et al. |
| 5,861,055 A | 1/1999 | Allman et al. |
| 5,888,120 A | 3/1999 | Doran |
| 5,948,697 A | 9/1999 | Hata |
| 5,957,757 A | 9/1999 | Berman |
| 6,060,370 A | 5/2000 | Hsia et al. |
| 6,066,266 A | 5/2000 | Osugi et al. |
| 6,077,783 A | 6/2000 | Allman et al. |
| 6,114,215 A | 9/2000 | Osugi et al. |
| 6,115,233 A | 9/2000 | Seliskar et al. |
| 6,247,998 B1 * | 6/2001 | Wiswesser et al. ............ 451/6 |
| 6,284,586 B1 | 9/2001 | Seliskar et al. |

\* cited by examiner

*Primary Examiner*—Tuan H. Nguyen
*Assistant Examiner*—Craig Thompson

(57) ABSTRACT

A method for planarizing an integrated circuit on a substrate to a target surface of the substrate where at least portions of the target surface are of a first material having a first reflectivity. The substrate is overlaid with a top layer of a second material having a second reflectivity thereby forming an upper surface. Material is removed from the upper surface in a planarizing process, and the first reflectivity and second reflectivity of the upper surface are sensed with multiple wavelengths of electromagnetic radiation. The planarization process is stopped when a ratio of the second reflectivity to the first reflectivity equals a predetermined value.

20 Claims, 2 Drawing Sheets

METHOD FOR CMP ENDPOINT DETECTION

1. FIELD

This application claims priority on copending United States provisional application Ser. No. 60/273,959, filed Mar. 6, 2001. This invention relates to the field of integrated circuit processing. More particularly, this invention relates to a method for planarizing the surface of an integrated circuit whereby an endpoint can be readily detected.

2. BACKGROUND

There is continual pressure for integrated circuits to be increasingly faster and increasingly more powerful. Both of these objectives tend to be influenced by the size of the integrated circuits. By fabricating smaller integrated circuits, electrical pathways are shorter and more devices are formed within a given space, which tends to result in a faster, more powerful integrated circuit.

As the size of devices is reduced, it is increasingly difficult to adequately fill and cover the devices with the successive layers of material from which the devices are formed. This is because the small feature size tends to produce surfaces that are extremely uneven. If the extremely uneven surfaces are not modified in some manner, then the overlying layers of material tend to suffer from a variety of problems, such as not conforming to the underlying surface in a uniform manner, forming pinholes and cracks either during deposition or during subsequent processing, and cracking from unbalanced and unalleviated stresses.

These problems, and others, are reduced in large measure by planarizing the substrate in some manner. During a planarization process, material is removed from the surface of the substrate to obtain a substantially flat surface. The planarization process is stopped when the surface of the substrate reaches a target surface. The target surface is generally known as an endpoint. If an endpoint cannot be readily detected, then either too much material or too little material tends to be removed from the surface of the substrate, which may undesirably affect the performance of the integrated circuit.

What is needed, therefore, is a method for planarizing the surface of an integrated circuit whereby an endpoint can be readily detected.

SUMMARY

The above and other needs are met by a method for planarizing an integrated circuit on a substrate to a target surface of the substrate where at least portions of the target surface are of a first material having a first reflectivity. The substrate is overlaid with a top layer of a second material having a second reflectivity, thereby forming an upper surface. Material is removed from the upper surface in a planarizing process, and the first reflectivity and second reflectivity of the upper surface are sensed with multiple wavelengths of electromagnetic radiation. The planarization process is stopped when a ratio of the second reflectivity to the first reflectivity equals a predetermined value.

Thus, by sensing the first reflectivity, the second reflectivity, or a combination of the first and second reflectivity with multiple wavelengths of electromagnetic radiation, a planarization process endpoint can be readily detected. If only one wavelength of electromagnetic radiation is used, the change or reversal in reflectivity may not be sensed in some portions of the thickness cycle of the first material. By using multiple wavelengths of electromagnetic radiation, the combined cycle of the multiple wavelengths overlap and at least one wavelength will sense the change in reflectivity in all portions of the thickness cycle of the first material, thereby preventing too much or too little material from being removed from the substrate.

In various preferred embodiments of the invention, the first material is silicon oxide and the second material is titanium nitride. The planarization process for removing material from the substrate is preferably chemical mechanical polishing, with use of an oxide slurry. The first and second reflectivities are preferably sensed by at least three wavelengths of electromagnetic radiation, which originate from a single lasing device. In an alternate embodiment, the multiple wavelengths originate from at least three lasing devices. Most preferably, the sum of any two of the multiple wavelengths of electromagnetic radiation is greater than any one of the multiple wavelengths. The planarization process is preferably stopped when the predetermined value of the ratio of the second reflectivity to the first reflectivity equals about zero, which indicates that all of the second material has been removed.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
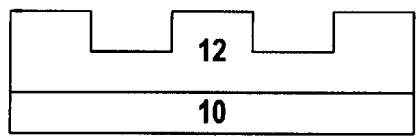
FIG. 1 is a cross sectional side view of an integrated circuit depicting a layer to be planarized.

Referring now to FIG. 1, there is depicted a portion of an integrated circuit 13. The example of FIG. 1 depicts a substrate 10, which in a preferred embodiment, is silicon. A first layer 12 is deposited upon the substrate 10. Preferably, the first layer 12 is silicon oxide. It is appreciated that, although the current example is made with reference to a silicon substrate and an overlying layer of silicon oxide, the invention has applicability to other points in the processing of the integrated circuit 13 as well, in addition to other materials. Further, there may be additional layers between the substrate 10 and the first layer 12, which are not depicted in the figures for the sake of clarity in the figures and the explanation of the method. The first layer 12 has a first reflectivity. It is understood that the number of layers shown in FIG. 1 are exemplary, and the invention is not limited to the number of layers shown or the materials specifically disclosed.

As shown in FIG. 1, the first layer 12 has an uneven surface with raised and depressed regions. In the formation of the integrated circuit 13, it is desired that the first layer 12 comprise a substantially flat surface without raised or depressed regions. The first layer 12 may comprise any number or pattern of raised and depressed regions and the raised and depressed regions shown in FIG. 1 are only illustrative of one possible surface profile of the first layer 12.

Figure 2:
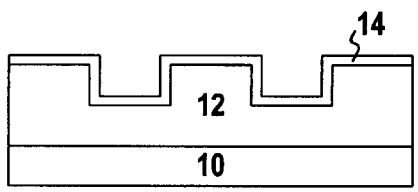
FIG. 2 is a cross sectional side view of an integrated circuit to be planarized depicting a layer having a first reflectivity and another overlaid layer having a different reflectivity.

FIG. 2 depicts the integrated circuit 13 with the substrate 10, the first layer 12, and a top layer 14, wherein the top layer 14 has a second reflectivity that is different from the reflectivity of the first layer 12. The top layer 14 may be deposited on the first layer 12 in any suitable manner known in the art. Preferably, the top layer 14 comprises titanium nitride. Other materials may also be suitable for use as the top layer 14 as long as the second reflectivity of the top layer 14 is preferably readily distinguishable from the first reflectivity of the first layer 12. It is also preferable that the material and mode of deposition of the top layer 14 be compatible with the functions and processing as described elsewhere herein. However, the invention is particularly applicable to a titanium nitride cap 14 over a silicon oxide layer 12.

Figure 3:
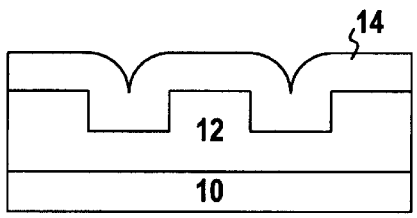
FIG. 3 is a cross sectional side view of an alternate overlaid layer.

The top layer 14 shown in FIG. 2 is a relatively thin layer that substantially conforms to the uneven surface of the first layer 12. However, the invention is not limited to a certain thickness or surface profile of the top layer 14. FIG. 3 depicts a relatively thick top layer 14, wherein the top layer 14 substantially fills the depressed regions of first layer 12. The various thicknesses of top layer 14 shown in FIGS. 2 and 3 are exemplary, and the actual thickness of the top layer 14 may be greater or less than that shown. Most preferably the titanium nitride cap layer 14 is as much as about six hundred angstroms thick, and most preferably about three hundred angstroms thick.

Figure 4:
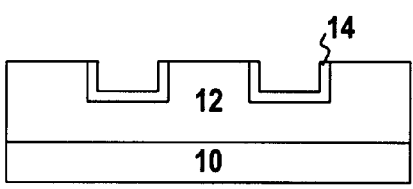
FIG. 4 is a cross sectional side view of a partially planarized layer.
Figure 5:
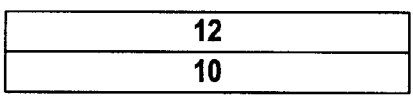
FIG. 5 is a cross sectional side view of a fully planarized layer.

The integrated circuit 13 undergoes a planarization process, shown partially completed in FIG. 4, in which material is removed from the surface of the integrated circuit 13 until the surface of the integrated circuit 13 reaches a target surface, as depicted in FIG. 5. In a preferred embodiment, the planarization process comprises chemical mechanical polishing. In this preferred embodiment, the chemical mechanical polishing further comprises use of an oxide slurry to polish the integrated circuit 13, even though the top layer 14 is not preferably an oxide. The integrated circuit 13 depicted in FIG. 4 is partially planarized, such that portions of both the first layer 12 and the top layer 14 have been removed. Thus, the point in the planarization process depicted in FIG. 4 represents an intermediate step of the planarization process, where some but not all of the features on the surface of the integrated circuit 13 have been planarized.

During the planarization process, the first reflectivity of the first layer 12 and the second reflectivity of the top layer 14 are sensed by multiple wavelengths of electromagnetic radiation. The multiple wavelengths of electromagnetic radiation may sense the first reflectivity of the first layer 12, the second reflectivity of the top layer 14 or a combination of the first and second reflectivities. This is preferably accomplished by scanning one or more lasing devices across the surface of the integrated circuit 13, such as by rotating the substrate 10 under the lasing devices. This may be accomplished in a manner similar to that as described in U.S. Pat. No. 5,985,679, the entirety of which in included herein by reference. In a preferred embodiment wherein the planarization process comprises chemical mechanical polishing, the chemical mechanical polishing utilizes a polishing pad to planarize the upper surface. The polishing pad has a window therein for allowing the multiple wavelengths of electromagnetic radiation to pass through the pad and reflect from the upper surface of the integrated circuit 13. The reflected signal passes through the window on the polishing pad and may be detected by any suitable means known in the art.

The planarization process is stopped when a ratio of the second reflectivity to the first reflectivity reaches a predetermined value. In a preferred embodiment, the top layer 14 is substantially completely removed, which indicates that the lowest most point on the surface of the first layer 12 has been reached in the planarization process. In other words, when substantially all of the top layer 14 has been removed, the first layer 12 has been completely planarized.

In this embodiment, the ratio of the second reflectivity to the first reflectivity goes to about zero. In other words, there is no more of the second reflectivity that is sensed, and all of the reflectivity that is sensed is that of the first reflectivity from the first layer 12. Since the second reflectivity of the top layer 14 and the first reflectivity of the first layer 12 are preferably readily distinguishable, once the top layer 14 is removed the signal reflected from the upper surface of the integrated circuit 13 will indicate a reversal in reflectivity. However, it is appreciated that it may be desirable to stop the planarization at a different point in the processing, such as when the ratio of reflectivities reaches some other predetermined value, which corresponds to some partially planarized state of the integrated circuit 13.

When the predetermined value of the ratio is reached, the planarization process is stopped. By predetermining a desired value for the ratio of the second reflectivity to the first reflectivity, the planarization process can be stopped when the target surface is reached. FIG. 5 depicts a fully planarized integrated circuit 13 wherein the top layer 14 has been completely removed and the surface of the first layer 12 is substantially flat. In the example as depicted, this depicts the desired target surface. It is appreciated that at any given point in the planarization process, there is an intermediate upper surface, which is initially the top surface of the integrated circuit 13 as depicted in FIGS. 2 and 3, and at a point part of the way through the planarization process is an intermediate surface as depicted in FIG. 4, and at the end of the process is the target surface as depicted in FIG. 5.

Figure 7:
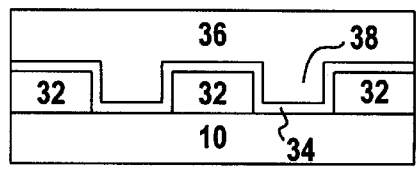
FIG. 7 is a cross sectional side view of an alternate layer to be planarized depicting a layer having a first reflectivity, a barrier layer, and another overlaid layer having a different reflectivity.

In an alternate embodiment depicted in FIG. 7, alternate first layer 32 having a first reflectivity is deposited upon the substrate 10. Preferably, the substrate 10 is silicon and the alternate first layer 32 is silicon oxide. It is appreciated that, although the current example is made with reference to a silicon substrate and an overlying layer of silicon oxide, the invention has applicability to other points in the processing of the integrated circuit 13 as well, in addition to other materials. The alternate first layer 32 has a first reflectivity. It is to be understood that the number of layers shown in FIG. 7 are exemplary, and the invention is not limited to the number of layers shown or the materials specifically disclosed.

Figure 10:
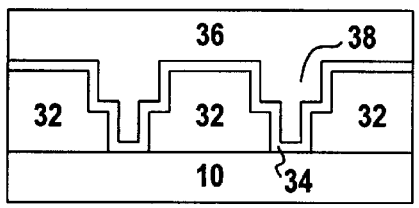
FIG. 10 is a cross sectional side view of another alternate layer to be planarized depicting a layer having a first reflectivity, a barrier layer, and another overlaid layer having a different reflectivity.

As shown in FIG. 7, the alternate first layer 32 has an uneven surface with raised and depressed regions. Alternate first layer 32 may also have trenched regions 38 which separate portions of alternate first layer 32. The alternate first layer 32 may comprise any number or pattern of raised and depressed regions as well as trenched regions and the raised, depressed, and trenched regions shown in FIG. 7 are only illustrative of one possible surface profile of the alternate first layer 32. FIG. 10 depicts one alternate surface profile of alternate first layer 32 and trenched regions 38. FIG. 7 depicts the substrate 10, the alternate first layer 32, a barrier layer 34 having a third reflectivity, and an alternate top layer 36. Preferably, the barrier layer 34 is a relatively thin layer which substantially conforms to the surface profile of the alternate first layer 32. In trenched regions 38, the barrier layer 34 preferably conforms to the surface profile of the substrate 10. It is to be understood that the profile and thickness of barrier layer 34 shown are only exemplary and barrier layer 34 may comprise various profiles and thickness. Barrier layer 34 is preferably deposited upon the surface of alternate first layer 32 and upon the surface of substrate 10 in the trenched regions 38 and then alternate top layer 36 is preferably deposited upon the surface of the barrier layer 34. In this embodiment, alternate top layer 36 preferably comprises a metal.

Figure 8:
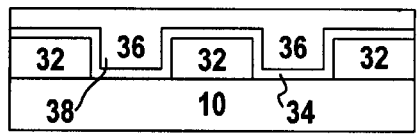
FIG. 8 is a cross sectional side view of the partially planarized alternate layer.

As shown in FIG. 8, the integrated circuit 13 undergoes a planarization process, in which material is removed from the surface of the integrated circuit 13 until the surface of the integrated circuit 13 reaches a target surface. In this embodiment, the planarization process comprises chemical mechanical polishing further comprising use of a metal slurry to polish the integrated circuit 13. The integrated circuit 13 depicted in FIG. 8 is partially planarized, such that only portions of the alternate top layer 36 have been removed. Thus, the point in the planarization process depicted in FIG. 8 represents an intermediate step of the planarization process, where some but not all of the features on the surface of the integrated circuit 13 have been planarized.

In this alternate embodiment, the first reflectivity of the alternate first layer 32, the second reflectivity of the alternate top layer 36, and the third reflectivity of the barrier layer 34 are sensed by multiple wavelengths of electromagnetic radiation as described for the previous embodiment. The multiple wavelengths of electromagnetic radiation may sense the first reflectivity of the alternate first layer 32, the second reflectivity of the alternate top layer 36, the third reflectivity of the barrier layer 34, or a combination of the first, second, or third reflectivities. This is preferably accomplished by scanning one or more lasing devices across the surface of the integrated circuit 13 as previously described herein. In the preferred embodiment wherein the planarization process comprises chemical mechanical polishing, the polishing pad has a window therein for allowing the multiple wavelengths of electromagnetic radiation and the reflected signal to pass through as previously described.

Figure 9:
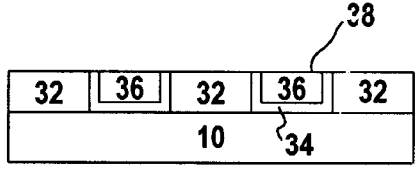
FIG. 9 is a cross sectional side view of the fully planarized alternate layer.

The planarization process is stopped when a ratio of the second reflectivity to the first reflectivity reaches a predetermined value. Preferably, the third reflectivity is also readily distinguishable from the first reflectivity such that the reflected signals will indicate a reversal in reflectivity when the alternate first layer 32 is exposed. In a preferred embodiment, the planarization process is stopped when the alternate first layer 32 is reached such that alternate first layer 32 will have little or substantially no material removed and portions of barrier layer 34 and alternate top layer 36 will remain in the trenched regions 38 of alternate first layer 32 as shown in FIG. 9.

When the predetermined value of the ratio is reached, the planarization process is stopped. By predetermining a desired value for the ratio of the second reflectivity to the first reflectivity, the planarization process can be stopped when the target surface is reached. FIG. 9 depicts a fully planarized integrated circuit 13 wherein the top surface depicts the desired target surface.

Figure 11:
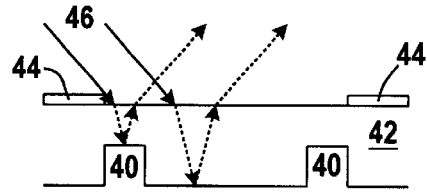
FIG. 11 is a cross sectional side view of an integrated circuit depicting a layer having a first reflectivity and another partially removed overlaid layer having a different reflectivity and further depicting multiple wavelengths of electromagnetic radiation being reflected from the layer having a first reflectivity.

FIG. 11 depicts the integrated circuit 13 with a substrate 40, a first layer 42 having a first reflectivity, and a top layer 44 having a second reflectivity. The integrated circuit 13 is scanned by multiple wavelengths of electromagnetic radiation 46. As the top layer 44 is removed by the planarization process, the first layer 42 is exposed. The multiple wavelengths of electromagnetic radiation 46 are reflected from the upper surface of the integrated circuit 13 and as shown in FIG. 11, the reflected signals indicate a reversal in reflectivity because the multiple wavelengths of electromagnetic radiation 46 are being reflected through the first layer 42 rather than from the top layer 44. In a preferred embodiment, the reflected signals are averaged such that a reversal in reflectivity from the second reflectivity to the first reflectivity will only be indicated when a majority of the top layer 44 has been removed by the planarization process.

If only a single wavelength is used to sense the first and second reflectivities or a combination of the first and second reflectivities, the wavelength may not detect a change in the first reflectivity for portions of the thickness cycle of the first material. In the preferred embodiment wherein the first material is silicon oxide, the first reflectivity of the first material silicon oxide, as sensed at a single given wavelength, increases with decreasing thickness during half of the thickness cycle while decreasing with decreasing thickness in the other half of the thickness cycle. Thus, a single wavelength of electromagnetic radiation tends to not accurately sense the difference between the first reflectivity and the second reflectivity as the cycle thickness of a relatively transparent layer, such as the first layer 12 of silicon oxide, is eroded. It is appreciated that conditions similar to that as described above exist with layers formed of other transparent and semi-transparent materials. It is further appreciated that by saying "reflectivity," it is understood that other optical properties that change with the cycle thickness of a material are also contemplated.

The cycle thickness of material, such as silicon oxide, is preferably given according to the following equation: $d = \frac{1}{2}\lambda (n^2 - \sin 2\alpha)^{-\frac{1}{2}}$, where d is the cycle thickness of the material, such as the silicon oxide, $\lambda$ is the wavelength of the electromagnetic radiation directed at the surface of the material, n is the reflective index of the material, and $\alpha$ is the angle of incidence of the electromagnetic radiation. Thus, for a 700 nanometer wavelength laser at an angle of incidence of ninety degrees, the cycle thickness of silicon oxide is about 2,400 angstroms. For many processes, missing the target surface during a planarization process by half of the cycle thickness as described above, which in the present example would be by about 1,200 angstroms, may destroy the integrated circuit being formed.

Figure 6:
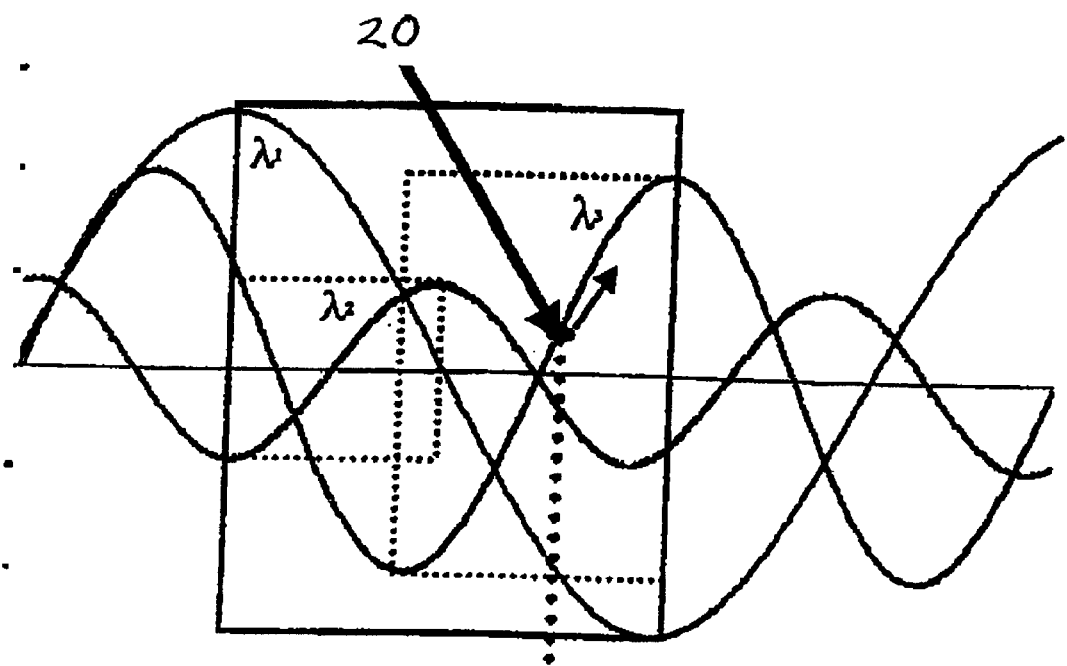
FIG. 6 is a graph depicting the detection of a planarization process endpoint using multiple wavelengths.

As shown in FIG. 6, multiple wavelengths with overlapping cycles can be combined such that changes in reflectivity can be better sensed, and the cycle thickness issues described above can be better overcome. As shown in FIG. 6, three different wavelengths of electromagnetic radiation are combined, each of which has a different cycle thickness in the material being sensed. Thus, each of the different wavelengths tends to be at a different point on its cycle with respect to the thickness of the material being sensed. By analyzing the reflectance received at each of the wavelengths, the true thickness of the material being sensed can be better determined. Additionally, the transition from the reflectivity of the top layer to the reflectivity of the underlying first layer is more easily detected. At lease one of the multiple wavelengths of electromagnetic radiation preferably detects any change or reversal in reflectivity as the top layer 14 is removed and the first layer 12 is exposed.

Thus, as shown in FIG. 6, the combined cycle of three wavelengths overlap each other. Once the reflectivity of the top layer 14, or cap layer of titanium nitride, is lost due to the transmission in the first layer 12, or oxide layer, at least one of the lasers preferably provides a reversal signal of oxide reflection, which indicates that the target surface or the interface between the reflective cap and the oxide has been reached.

Point 20 shown in FIG. 6 represents the detection of the planarization process endpoint when the second material is completely removed and the predetermined value of the ratio of the second reflectivity to the first reflectivity equals about zero. In a preferred embodiment, the multiple wavelengths of electromagnetic radiation comprise at least three wavelengths wherein the wavelengths all originate from a single lasing device. The multiple wavelengths of electromagnetic radiation may also originate from multiple lasing devices.

When using three different wavelengths it is preferred that the sum of any two of the multiple wavelengths of electromagnetic radiation be greater than any one of the multiple wavelengths. However, when using more than three wavelengths, this condition is preferably satisfied for at least three of the wavelengths, but not necessarily for the other wavelengths. Alternately, a tunable wavelength laser can be used, which emits only a single wavelength at any given time, but which can be adjusted to at least three different wavelengths, with the reflectivity of each wavelength sensed and analyzed in reference to the others.

The phase deltas of the wavelengths used, or in other words the shift between the phases of the wavelengths, is preferably appropriately combined, such as depicted in FIG. 6, so that a wide thickness range of the first layer 12, or oxide, can be sensed.

Because the target surface or endpoint of the planarization process can be more easily determined as described herein, it is possible to reduce the thickness of the first layer. For example, because the endpoint can be more easily determined, the thickness of a silicon oxide layer, such as a shallow trench isolation oxide layer, may not need to be as thick as traditionally deposited. The reason for this is that in some processes an additional thickness of oxide is deposited so that when the integrated circuit is planarized there is an extra amount of oxide which acts as a buffer when planarizing the integrated circuit. This extra thickness of oxide makes stopping the planarizing process at an exact target surface less critical. In other words, the planarization process can continue for an extra period of time without planarizing the oxide too long and removing too much of the layer. However, because the present invention provides a method for more easily detecting the endpoint of the planarization process, an extra thickness of oxide is not required as a buffer layer.

An endpoint detection device, such as one implementing the method as described above, is preferably mounted on a chemical mechanical polisher, such as those manufactured by Applied Materials, Inc. of Santa Clara, California, under the name of Mira Mesa. The endpoint detection device is preferably mounted as an in-situ removal monitor.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for planarizing an integrated circuit on a substrate to a target surface of the substrate where at least portions of the target surface are of a first material having a first reflectivity, the method comprising:
   overlaying the substrate with a top layer of a second material having a second reflectivity and thereby forming an upper surface,
   removing material from the upper surface in a planarizing process,
   sensing the first reflectivity and second reflectivity of the upper surface with multiple wavelengths of electromagnetic radiation, and
   ceasing the planarization process when a ratio of the second reflectivity to the first reflectivity equals a predetermined value.

2. The method of claim 1 wherein the first material is silicon oxide.

3. The method of claim 1 wherein the second material is titanium nitride.

4. The method of claim 1 wherein the multiple wavelengths of electromagnetic radiation further comprise at least three wavelengths.

5. The method of claim 1 wherein the multiple wavelengths of electromagnetic radiation originate from a single lasing device.

6. The method of claim 1 wherein the multiple wavelengths of electromagnetic radiation originate from at least three lasing devices.

7. The method of claim 1 wherein the sum of any two of the multiple wavelengths is greater than any one of the multiple wavelengths.

8. The method of claim 1 wherein the planarization process further comprises chemical mechanical polishing.

9. The method of claim 8 wherein the chemical mechanical polishing further comprises use of an oxide slurry.

10. The method of claim 1 wherein the predetermined value of the ratio of the second reflectivity to the first reflectivity equals about zero.

11. A method for planarizing an integrated circuit on a substrate to a target surface of the substrate where at least portions of the target surface are silicon oxide having a first reflectivity, the method comprising:
   overlaying the substrate with a top layer of titanium nitride having a second reflectivity and thereby forming an upper surface,
   removing material from the upper surface in a planarizing process, sensing the first reflectivity and second reflectivity at the upper surface with multiple wavelengths of electromagnetic radiation, and ceasing the planarization process when a ratio of the second reflectivity to the first reflectivity equals a predetermined value.

12. The method of claim 11 wherein the multiple wavelengths of electromagnetic radiation further comprise at least three wavelengths.

13. The method of claim 11 wherein the multiple wavelengths of electromagnetic radiation originate from a single lasing device.

14. The method of claim 11 wherein the multiple wavelengths of electromagnetic radiation originate from at least three lasing devices.

15. The method of claim 12 wherein the sum of any two of the multiple wavelengths is greater than any one of the multiple wavelengths.

16. The method of claim 11 wherein the planarization process further comprises chemical mechanical polishing.

17. The method of claim 16 wherein the chemical mechanical polishing further comprises use of an oxide slurry.

18. The method of claim 11 wherein the predetermined value of the ratio of the second reflectivity to the first reflectivity equals about zero.

19. A method for planarizing an integrated circuit on a substrate to a target surface of the substrate where at least portions of the target surface are of a first material having a first reflectivity, the method comprising:

overlaying the substrate with a top layer of a second material having a second reflectivity thereby forming an upper surface, removing material from the upper surface in a planarizing process, sensing the first reflectivity and second reflectivity of the upper surface with three wavelengths of electromagnetic radiation originating from a single lasing device wherein the sum of any two of the three wavelengths is greater than any one of the three wavelengths, and ceasing the planarization process when a ratio of the second reflectivity to the first reflectivity equals a predetermined value.

20. The method of claim 19 wherein the predetermined value of the ratio of the second reflectivity to the first reflectivity equals about zero.

* * * * *